(12) United States Patent
Thomas et al.

(10) Patent No.: US 11,085,011 B2
(45) Date of Patent: Aug. 10, 2021

(54) POST CMP CLEANING COMPOSITIONS FOR CERIA PARTICLES

(71) Applicant: ENTEGRIS, INC., Billerica, MA (US)

(72) Inventors: Elizabeth Thomas, New Milford, CT (US); Michael White, Ridgefield, CT (US); Daniela White, Ridgefield, CT (US); Atanu Kumar Das, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/527,809

(22) Filed: Jul. 31, 2019

(65) Prior Publication Data

US 2020/0071642 A1    Mar. 5, 2020

Related U.S. Application Data

(60) Provisional application No. 62/723,759, filed on Aug. 28, 2018.

(51) Int. Cl.

| | |
|---|---|
| *C11D 7/32* | (2006.01) |
| *C11D 11/00* | (2006.01) |
| *C11D 3/30* | (2006.01) |
| *C11D 3/39* | (2006.01) |
| *C11D 3/395* | (2006.01) |
| *C11D 3/20* | (2006.01) |
| *H01L 21/02* | (2006.01) |
| *C11D 3/37* | (2006.01) |
| *C11D 3/22* | (2006.01) |

(52) U.S. Cl.
CPC ........ *C11D 11/0047* (2013.01); *C11D 3/2068* (2013.01); *C11D 3/2086* (2013.01); *C11D 3/225* (2013.01); *C11D 3/30* (2013.01); *C11D 3/378* (2013.01); *C11D 3/3765* (2013.01); *C11D 3/3776* (2013.01); *C11D 3/3942* (2013.01); *C11D 3/3953* (2013.01); *H01L 21/02065* (2013.01)

(58) Field of Classification Search
CPC ................................................ C11D 11/0047
USPC .......................................................... 510/175
See application file for complete search history.

(56) References Cited

U.S. PATENT DOCUMENTS

| | | | |
|---|---|---|---|
| 2002/0077259 A1* | 6/2002 | Skee | C11D 11/0047 510/175 |
| 2005/0215183 A1 | 9/2005 | Siddiqui et al. | |
| 2007/0060490 A1* | 3/2007 | Skee | C11D 11/0047 510/175 |
| 2009/0107520 A1* | 4/2009 | Lee | C11D 11/0047 134/2 |
| 2009/0130849 A1* | 5/2009 | Lee | H01L 21/02074 438/693 |
| 2009/0137191 A1* | 5/2009 | Lee | C11D 11/0041 451/36 |
| 2010/0112728 A1* | 5/2010 | Korzenski | C09K 13/08 438/3 |
| 2011/0094536 A1* | 4/2011 | Lee | C23F 1/14 134/3 |
| 2013/0035272 A1* | 2/2013 | Lee | G03F 7/422 510/176 |
| 2016/0020087 A1 | 1/2016 | Liu et al. | |
| 2016/0130500 A1* | 5/2016 | Chen | C09K 13/02 216/13 |
| 2016/0240368 A1 | 8/2016 | Cui | |
| 2018/0037852 A1 | 2/2018 | Thomas et al. | |
| 2018/0204736 A1 | 7/2018 | White | |
| 2018/0204764 A1* | 7/2018 | Cooper | G03F 7/423 |

FOREIGN PATENT DOCUMENTS

TW    201627497 A    8/2016

* cited by examiner

*Primary Examiner* — Gregory E Webb
(74) *Attorney, Agent, or Firm* — Entegris, Inc.

(57) ABSTRACT

The invention provides a removal composition and process for cleaning post-chemical mechanical polishing (CMP) contaminants and ceria particles from a microelectronic device having said particles and contaminants thereon. The composition achieves highly efficacious removal of the ceria particles and CMP by-product contaminant material from the surface of the microelectronic device.

15 Claims, No Drawings

POST CMP CLEANING COMPOSITIONS FOR CERIA PARTICLES

FIELD OF THE INVENTION

The present invention relates generally to compositions for removing ceria particles and other chemical mechanical polishing slurry contaminants from microelectronic devices having same thereon.

BACKGROUND OF THE INVENTION

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (e.g., planarized) by coupling a physical process such as abrasion with a chemical process such as oxidation or chelation. In its most rudimentary form, CMP involves applying an abrasive slurry having an active chemistry to a polishing pad that buffs the surface of a microelectronic device wafer during the removal, planarization, and polishing processes. Removal or polishing processes using purely physical or purely chemical action are not as effective as the synergistic combination of both in order to achieve fast, uniform removal. In addition, in the fabrication of integrated circuits, the CMP slurry should also be able to preferentially remove films that comprise complex layers of metals and other materials so that highly planar surfaces can be produced for subsequent photolithography, or patterning, etching and thin-film processing.

In a front-end-of-the-line (FEOL) method for forming an isolation region in a silicon substrate using the shallow trench isolation (STI) process, a pad oxide film and a pad nitride film are deposited on a semiconductor substrate and patterned to expose portions of the substrate, which correspond to an isolation region. Then, the exposed regions of the substrate are etched to form a trench. Thereafter, the substrate is subjected to a sacrificial oxidation process to remove damage caused by the substrate etching followed by formation of a wall oxide film on the surface of the trench. Next, a trench-buried oxide film (e.g., an oxide film formed by high density plasma chemical vapor deposition referred to as an HDP-oxide film), is deposited on the surface of the substrate in such a manner as to be buried in the trench. Then, the surface of the HDP-oxide film is subjected to chemical mechanical polishing until the pad nitride film is exposed. The resulting substrate is then cleaned and the pad nitride film which was used as an etch barrier during the trench etch is removed, completing the formation of an isolation region.

A CMP slurry using ceria particles generally achieves a faster polishing speed for an insulator, relative to a silica-containing slurry. Moreover, a ceria-based slurry is most often used because of the ability to achieve STI pattern planarization with minimal oxide erosion. Disadvantageously, ceria-based slurries are difficult to remove from STI structures because of the oppositely charged zeta potentials of the ceria particles relative to the silicon oxide and silicon nitride surfaces. If a device is manufactured with these residues remaining on the wafer, the residues will lead to short circuits and an increase in electrical resistance. Ceria particles are also a problem with FinFET structures following CMP processing using ceria slurries.

Currently, the most efficient wet cleaning formulation for removing ceria particles is dilute hydrofluoric acid (DHF). However, DHF disadvantageously etches silicon oxide and other low-k dielectric materials.

Therefore, a need remains for a ceria particle removal composition and process that effectively removes ceria particles from a surface of a microelectronic device while not damaging the underlying materials such as silicon nitride, low-k dielectrics (e.g., silicon oxide), and tungsten-containing layers. The ceria particle removal composition should also efficaciously remove CMP slurry contaminants from the surface of the microelectronic device.

SUMMARY OF THE INVENTION

The present invention generally relates to a removal composition and process, particularly useful for cleaning ceria particles and CMP contaminants from microelectronic devices having said particles and CMP contaminants thereon, in particular microelectronic devices having PETEOS, Silicon Nitride, and Poly-Si substrates. In one aspect, the invention provides treatment of the microelectronic substrate having positively charged ceria particles thereon using oxidizing agents. In another aspect, a method of removing ceria particles and CMP contaminants from a microelectronic device having said particles and contaminants thereon is described, said method comprising contacting the microelectronic device with a removal composition for sufficient time to at least partially clean said particles and contaminants from the microelectronic device, wherein said removal composition comprises (i) at least one oxidizing agent; (ii) at least one complexing agent; (iii) at least one cleaning agent; (iv) at least one quaternary ammonium or quaternary phosphonium compound or inorganic hydroxide and (v) water; and optionally other ingredients.

DETAILED DESCRIPTION OF THE INVENTION

The present invention relates generally to compositions useful for the removal of positively-charged ceria particles and CMP contaminants from a microelectronic device having such material(s) thereon. The ceria particles and CMP contaminants are efficaciously removed using the compositions and further the compositions are compatible with silicon nitride and low-k dielectric (e.g., silicon oxide) layers. In a first aspect, the invention provides a composition, comprising, consisting of, or consisting essentially of a composition as set forth herein. In one embodiment, the invention provides a composition comprising (i) at least one oxidizing agent;
(ii) at least one complexing agent;
(iii) at least one cleaning agent;
(iv) at least one quaternary ammonium or quaternary phosphonium compound or inorganic hydroxide; and
(v) water.

As used herein, the term "oxidizing agent(s)" includes, but is not limited to: hydrogen peroxide; other per-compounds such as salts and acids containing peroxomonosulfate, perborate, perchlorate, periodate, persulfate, permanganate, and peracetate anions; and amine-N-oxides. Further examples include $FeCl_3$, $FeF_3$, $Fe(NO_3)_3$, $Sr(NO_3)_2$, $COF_3$, $MnF_3$, ozone ($2KHSO_5 \cdot KHSO_4 \cdot K_7SO_4$), iodic acid, vanadium (V) oxide, vanadium (IV, V) oxide, ammonium vanadate, ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_4$), ammonium persulfate (($NH_4)_2S_2O_8$), ammonium hypochlorite ($NH_4ClO$)), ammonium tungstate (($NH_4)_{10}H_2(W_2O_7)$)), sodium polyatotnic salts (e.g., sodium persulfate ($Na_2S_2O_8$), sodium hypochlorite (NaClO), sodium perborate), potassium polyatomic salts (e.g., potassium iodate ($KIO_3$), potassium permanganate ($KMnO_4$), potassium persulfate, nitric acid ($HNO_3$), potassium persulfate ($K_2S_2O_8$), potassium hypochlorite (KClO)), tetramethyl ammonium polyatomic salts (e.g., tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), tetrabutylammonium polyatomic salts (e.g., tetrabutylammonium peroxomonosulfate), peroxotnonosulfuric acid, ferric nitrate ($Fe(NO_3)_3$), urea hydrogen peroxide (($CO(NH_2)_2)H_2O_2$), peracetic acid ($CH_3(CO)OOH$), 1,4-benzoquinone, toluquinone, dimethyl-1,4-benzoquinone, chloranil, alloxan, N-methylmorpholine N-oxide, trimethylamine N-oxide, and combinations thereof. Other examples of oxidizing agents include perbromic acid, telluric acid trifluoroperacetic acid, m-chloroperbenzoic acid, t-butyl hydroperoxide, dibenzoyl peroxide, potassium peroxysulfate (e.g., Oxone® DuPont), methylethylketone peroxide, acetone peroxide, ethylhydroperoxide, and cumene hydroperoxide.

In one embodiment, the amount of oxidizing agent is in a range from about 0.001 wt % to 5 wt %, and in another embodiment in a range of about 0.001 wt % to about 2 wt %, based on the total weight of the composition.

As used herein, the term "complexing agent" includes those compounds that are understood by one skilled in the art to be complexing agents, chelating agents and/or sequestering agents, or otherwise interacts with the Ceria. Complexing agents will chemically combine with or physically hold the metal atom and/or metal ion to be removed using the compositions described herein. Complexing agents include species having the general formula $NR^1R^2R^3$, wherein $R^1$, $R^2$ and $R^3$ may be the same as or different from one another and are chosen from hydrogen, straight-chain or branched $C_1$-$C_6$ alkyl (e.g., methyl, ethyl, propyl, butyl, pentyl, and hexyl) groups, straight-chain or branched $C_1$-$C_6$ hydroxyalkyl (e.g., hydroxymethyl, hydroxyethyl, hydroxypropyl, hydroxybutyl, hydroxypentyl, and hydroxyhexyl) groups, and $C_1$-$C_6$ alkyl ethers of straight chain or branched $C_1$-$C_6$ hydroxyalkyl groups as defined above. In certain embodiments, at least one of $R^1$, $R^2$ and $R^3$ is a straight-chain or branched $C_1$-$C_6$ hydroxyalkyl group. Examples include, without limitation, alkanolamines such as aminoethylethanolamine, N-methylaminoethanol, aminoethoxyethanol, dimethylaminoethoxyethanol, diethanolamine, N-methyldiethanolamine, monoethanolamine (MEA), triethanolamine (TEA), 1-amino-2-propanol, 2-amino-1-butanol, isobutanolamine, triethylenediamine, other $C_1$-$C_8$ alkanolamines and combinations thereof (In the illustrative examples in Table 1 below, the alkanolamine is listed in the "amine" column.) When the amine includes the alkylether component, the amine may be considered an alkoxyamine, e.g., 1-methoxy-2-aminoethane. Alternatively, or in addition to the $NR^1R^2R^3$ amine, the complexing agent may be a multi-functional amine including, but not limited to, 4-(2-hydroxyethyl)morpholine (HEM), 1,2-cyclohexanediamine-N,N,N',N'-tetraacetic acid (CDTA), ethylenediaminetetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, and combinations thereof. Alternatively, or in addition to the aforementioned complexing agents, additional complexing agents can include phosphonates (e.g., 1-hydroxyethylidene-1,1-diphosphonic acid (HEDP), 1,5,9-triazacyclododecane-N,N',N''-tris(methylenephosphonic acid) (DOTRP), 1,4,7,10-tetraazacyclododecane-N,N,N'',N'''-tetrakis(methylenep-hosphonic acid) (DOTP), nitrilotris(methylene)triphosphonic acid, diethylenetriaminepentakis(methylenephosphonic acid) (DETAP), aminotri(methylenephosphonic acid), bis(hexamethylene)triamine pentamethylene phosphonic acid, 1,4,7-triazacyclononane-N,N',N''-tris(methylenephosphonic acid (NOTP), hydroxyethyldiphosphonate, nitrilotris(methylene)phosphonic acid, 2-phosphono-butane-1,2,3,4-tetracarboxylic, carboxy ethyl phosphonic acid, aminoethyl phosphonic acid, glyphosate, ethylene diamine tetra(methylenephosphonic acid) phenylphosphonic acid, salts thereof, and derivatives thereof) and/or carboxylic acids (e.g., oxalic acid, succinnic acid, sulfosuccinic acid, sulfophthalic acid, maleic acid, malic acid, malonic acid, adipic acid, phthalic acid, citric acid, sodium citrate, potassium citrate, ammonium citrate, tricarballylic acid, trimethylolpropionic acid, tartaric acid, glucuronic acid, 2-carboxypyridine, etidronic acid, amino tris(methylenephosphonic acid)) and/or sulfonic acids such as tiron (4,5-Dihydroxy-1,3-benzenedisulfonic acid disodium salt). In certain embodiments, the at least one complexing agent comprises a species chosen from monoethanolamine, triethanolamine, sulfuric acid, citric acid and combinations thereof. In one embodiment, the amount of complexing agent(s) in the removal composition is in a range from about 0.01 wt % to about 10 wt %, based on the total weight of the removal composition.

The composition also comprises at least one cleaning agent. Said cleaning agents are chosen from at least one of (i) one or more water miscible solvent(s) and/or (ii) one or more one polymer(s).

Examples of water-miscible solvents include, glycols, and glycol ethers, including, but not limited to, methanol, ethanol, isopropanol, butanol, and higher alcohols (such as $C_2$-$C_4$ diols and $C_2$-$C_4$ triols), tetrahydrofurfuryl alcohol (THFA), halogenated alcohols (such as 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), 3-amino-4-octanol, dichloromethane, chloroform, acetic acid, propionic acid, trifluoroacetic acid, tetrahydrofuran N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, ethylene glycol monophenyl ether, diethylene glycol monophenyl ether hexaethylene glycol monophenylether, dipropylene glycol methyl ether acetate, tetraethylene glycol dimethyl ether (TEGDE), dibasic ester, glycerine carbonate, N-formyl morpholine, triethyl phosphate, and combinations thereof. Polymers, when present, include, but are not limited to, methacrylic acid homopolymer and copolymers with, for example, acrylamidomethylpropane sulfonic acid and maleic acid; maleic acid/vinyl ether copolymer; poly(vinylpyrrolidone)/vinyl acetate; homopolymers such as phosphonated polyethyleneglycol oligomers, poly(acrylic acid) (PAA), poly(acrylamide), poly(vinyl acetate), poly(ethylene glycol) (PEG), polypropylene glycol) (PPG), poly(styrene sulfonic acid), poly(vinyl sulfonic acid), poly(vinyl phosphonic acid), poly(vinyl phosphoric acid), poly(ethyleneimine), poly(propyleneimine), polyallylamine, polyethylene oxide (PEO), polyvinyl pyrrolidone (PVP), PPG-PEG-PPG block copolymers, PEG-PPG-PEG block copolymers, poly(vinyl alcohol), poly(hydroxyethyl)acrylate, poly(hydroxyethyl)methacrylate, hydroxyethyl cellulose, methylhydroxyethyl cellulose, hydroxypropyl cellulose, methylhydroxypropyl cellulose, xanthan gum, potassium alginate, pectin, carboxymethylcellulose, glucosamine, poly(diallyldimethylammonium) chloride, PEGylated (i.e., polyethyleneglycol-ated) methacrylate/acrylate copolymers, poly MADQuat and copolymers thereof, dimethylaminomethacrylate polymers and copolymers thereof, trimethylammonium methylmethacrylate polymers (i.e water-miscible solvents) and copolymers thereof, and combinations thereof. The copolymers above may be random or block copolymers. When present, the amount of polymer(s) in the composition is in a range from about 0.0001 weight % to about 5 weight %, based on the total weight of the composition. In another embodiment the amount of polymer(s) in the composition is in the range from about 0.0001 weight % to about 20 weight %, based on the total weight of the composition.

In certain embodiments, the pH of the composition is greater than 8, greater than 9, greater than 10 or greater than 11, less than 14, less than 13, less than 12, or less than 11. In certain embodiments, the pH is about 8 to 11.5; after dilution, the pH in certain embodiments is greater than 7, greater than 8, greater than 9 or greater than 10, less than 13, less than 12, or less than 11. In certain embodiments, the pH of the diluted composition is about 8 to 12.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "ceria particles" corresponds to cerium-based abrasive particles that may be used in chemical mechanical polishing slurries, including, for example, a cerium oxide having the formula $Ce_2O_3$ and $CeO_2$. It should be appreciated that the "ceria particles" may comprise, consist of, or consist essentially of cerium oxide.

As used herein, "contaminants" correspond to chemicals present in the CMP slurry, reaction by-products of the polishing slurry, post-CMP residue, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., chemicals present in the slurry, reaction by-products of the polishing slurry, carbon-rich particles, polishing pad particles, brush deloading particles, equipment materials of construction particles, metal, organic, organometallic, organosilicic, or inorganic in nature, for example, silicon-containing material, titanium-containing material, nitrogen-containing material, oxygen-containing material, polymeric residue material, copper-containing residue material (including copper oxide residue), tungsten-containing residue material, cobalt-containing residue material, etch gas residue such as chlorine and fluorine, and combinations thereof and any other materials that are the by-products of the CMP process As used herein, the term "low-k dielectric material" corresponds to any material used as a dielectric material in a layered microelectronic device, wherein the material has a dielectric constant less than about 3.5. In certain embodiments, the low-κ dielectric materials include low-polarity materials such as silicon-containing organic polymers, silicon-containing hybrid organic/inorganic materials, organosilicate glass (OSG), TEOS, fluorinated silicate glass (FSG), silicon dioxide, silicon oxycarbide, silicon oxynitride, silicon nitride, carbon-doped oxide (CDO) or carbon-doped glass, for example, CORAL™ from Novellus Systems, Inc., BLACK DIAMOND™ from Applied Materials, Inc. (e.g., BD1, BD2, and BD3 designations for PECVD) SiLK™ dielectric resins from Dow (polymers based on crosslinked polyphenylenes by reaction of polyfunctional cyclopentadienone and acetylene-containing materials; see, for example, U.S. Pat. No. 5,965,679, incorporated herein by reference), and NANOGLASS™ of Nanopore, Inc, (Silica aerogel/xerogel (known as nanoporous silica), and the like. It is to be appreciated that the low-κ dielectric materials may have varying densities and varying porosities.

As used herein, the term "etchant" refers to: hydrofluoric acid (HF); fluorosilicic acid ($H_2SiF_6$); fluoroboric acid; ammonium fluorosilicate salt (($NH_4$)$_2SiF_6$); tetramethylammonium hexafluorophosphate; ammonium fluoride; ammonium bifluoride; quaternary ammonium tetrafluoroborates and quaternary phosphonium tetrafluoroborates and combinations thereof.

As used therein, the term "metal corrosion inhibitors" refers to non-ionic surfactants such as PolyFox PF-159

(OMNOVA Solutions), polyethylene glycol) ("PEG"), poly(propylene glycol) ("PPG"), ethylene oxide/propylene oxide block copolymers such as Pluronic F-127 (BASF), a polysorbate polyoxyethylene (20) sorbitan monooleate (Tween 80), polyoxyethylene (20) sorbitan monostearate (Tween 60), polyoxyethylene (20) sorbitan monopalmitate (Tween 40), polyoxyethylene (20) sorbitan monolaurate (Tween 20)), polyoxypropylene/polyoxyethylene block copolymers (e.g., Pluronic L31, Plutonic 31R1, Pluronic 25R2 and Pluronic 25R4), and combinations thereof and such compounds in combination with azoles such as 5-aminotetrazole, 5-phenyl-benzotriazole, 1H-tetrazole-5-acetic acid, 1-phenyl-2-tetrazoline-5-thione, benzimidazole, methyltetrazole, Bismuthiol I, cytosine, guanine, thymine, pyrazoles, iminodiacetic acid (IDA), propanethiol, benzohydroxamic acids, citric acid, ascorbic acid, 5-amino-1,3,4-thiadiazole-2-thiol (ATDT), benzotriazole (BTA), 1,2,4-triazole (TAZ), tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), sodium dedecyl sulfate (SDS), ATA-SDS, 3-amino-5-mercapto-1,2,4-triazole, pentylenetetrazole, 5-phenyl-1H-tetrazole, 5-benzyl-1H-tetrazole, Ablumine O, 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2,4-triazole, 3-amino-5-methylthio-1H-1,2,4-triazole, benzothiazole, imidazole, indiazole, adenine, succinimide, adenosine, carbazole, saccharin, uric acid, benzoinoxime, cationic quaternary salts (e.g., benzalkonium chloride, benzyldimethyldodecylammonium chloride, myristyltrime thylammonium bromide, dodecyltrimethylammonium bromide, hexadecylpyridinium chloride, Aliquot 336 (Cognis), benzyldimethylphenylammonium chloride, Crodaquat TES (Croda. Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzylditnethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldime thylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate, 1-decyl-3-methylimidazolium chloride, tridodecylmethylammonium bromide, dimethyldistearylammonium chloride, cetyltrimethylammonium bromide, myristyltrimethylammonium bromide, and hexamethonium chloride), anionic surfactants (e.g., dodecylbenzenesulfonic acid, sodium dodecylbenzenesulfonate, dodecylphosphonic acid (DDPA), and combinations thereof).

As used herein, the term "low-k passivating agents" refers to compounds which reduce the chemical attack of the low-k layers and to protect the wafer from additional oxidation. Boric acid is one example of a low-k passivating agent, although other hydroxyl additives are known for such purpose, e.g., 3-hydroxy-2-naphthoic acid, malonic acid, iminodiacetic acid, ammonium pentaborate, urea, methyltriethoxysilane and mixtures thereof.

"Substantially devoid" is defined herein in certain embodiments as less than 2 wt. %, less than 1 wt. %, less than 0.5 wt. %, or less than 0.1 wt. %. "Devoid" is intended in certain embodiments to correspond to less than 0.001 wt % to account for environmental contamination, and in another embodiment, 0.0 wt. %.

In some embodiments, the compositions are substantially devoid of (a) corrosion inhibitors; (b) etchants; and (c) passivation agents. In other embodiments, the compositions are devoid of (a) corrosion inhibitors; (b) etchants; and (c) passivation agents As used herein, "about" is intended to correspond to +/−0.5% of the stated value.

As used herein, the term "buffer" refers to common buffers such as phosphate salts (e.g., diammonium hydrogen phosphate, ammonium dihydrogen phosphate, ammonium phosphate) and carbonates such as potassium hydrogen carbonate and potassium carbonate. When present, the composition comprises about 0.1 wt % to about 20 wt % buffering species, based on the total weight of the composition.

As used herein, "suitability" for removing ceria particles and CMP contaminants from a microelectronic device having said particles and contaminants thereon corresponds to at least partial removal of said particles/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity (e.g., 231-235) and the number of particles counted. The particle reduction may be calculated using:

$$\text{Cleaning Efficacy} = \frac{\left(\begin{array}{c}\text{Number of PreClean Objects} - \\ \text{Number of PostClean Objects}\end{array}\right)}{\text{Number of PreClean Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the removal composition. In certain embodiments, at least 75% of the particles/contaminants are removed from the microelectronic device using the compositions described herein, at least 90%, at least 95%, or at least 99% of the particles/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.00001 weight percent, based on the total weight of the composition in which such components are employed.

In order to adjust the pH to the desired endpoint, quaternary ammonium compounds and/or quaternary phosphonium compounds may be utilized. As used herein, the term "quaternary ammonium compound" refers to its ordinary meaning and includes tetraalkylammonium hydroxide, compounds having the formula $NR^4R^5R^6R^7OH$, wherein $R^4$, $R^5$, $R^6$ and $R^7$ may be the same as or different from one another and are chosen from hydrogen, straight-chain or branched $C_1$-$C_6$ alkyl (e.g., methyl, ethyl, propyl, butyl, pentyl, and hexyl) groups, $C_1$-$C_6$ hydroxyalkyl (e.g., hydroxymethyl, hydroxyethyl, hydroxypropyl, hydroxybutyl, hydroxypentyl, and hydroxyhexyl) groups, methyltriethylammonium hydroxide, diethyldimethylammonium hydroxide, ethyltrimethylammonium hydroxide, choline hydroxide, methyltris(hydroxyethyl)ammonium hydroxide, potassium hydroxide, cesium hydroxide, and substituted or unsubstituted $C_6$-$C_{10}$ aryl groups (e.g., benzyl groups). Tetraalkylammonium hydroxides that are commercially available include tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, and combinations thereof, may be used.

Alternatively or in addition, the pH may be adjusted using a quaternary phosphonium compound having the formula $(PR^8R^9R^{10}R^{11})OH$, wherein $R^8$, $R^9$, $R^{10}$, and $R^{11}$ may be the same as or different from one another and are selected from the group consisting of hydrogen, straight-chain $C_1$-$C_6$ alkyl (e.g., methyl, ethyl, propyl, butyl, pentyl, and hexyl) groups, branched $C_1$-$C_6$ alkyl groups, $C_1$-$C_6$ hydroxyalkyl (e.g., hydroxymethyl, hydroxyethyl, hydroxypropyl, hydroxybutyl, hydroxypentyl, and hydroxyhexyl) groups, substituted $C_6$-$C_{10}$ aryl groups, unsubstituted $C_6$-$C_{10}$ aryl groups (e.g., benzyl groups), and any combination thereof; Tetraalkylphosphonium hydroxides that are commercially available include tetramethylphosphonium hydroxide (TMPH), tetraethylphosphonium hydroxide (TEPH), tetrapropylphosphonium hydroxide (TPPH), tetrabutylphosphonium hydroxide (TBPAH), tributylmethylphosphonium hydroxide (TBMPAH), benzyltrimethylphosphonium hydroxide (BTMPH), ethyltrimethylphosphonium hydroxide, tris(2-hydroxyethyl)methyl phosphonium hydroxide, diethyldimethylphosphonium hydroxide, and combinations thereof, may be used. Acids include, but are not limited to, nitric acid, sulfuric acid, phosphoric acid, hydrochloric acid, hydrobromic acid, methanesulfonic acid, benzenesulfonic acid, p-toluenesulfonic acid, trifluoromethanesulfonic acid, acetic acid, lactic acid, glycolic acid, and any combination thereof. In one embodiment, the pH adjusting agent comprises KOH. In another embodiment, the pH adjusting agent comprises choline hydroxide. In yet another embodiment, the pH adjusting agent comprises ammonium hydroxide. Alternately, in addition to a quaternary ammonium compound and/or a quaternary phosphonium compound, a the pH adjusting agent may further comprises at least one alkali metal hydroxide. In another embodiment, the pH adjusting agent comprises KOH and at least one additional hydroxide enumerated herein. In still another embodiment, the pH adjusting agent comprises KOH and at least one of choline hydroxide and ammonium hydroxide. To any of these enumerated embodiments, the pH adjusting agent can further include at least one acid, for example, sulfuric acid, citric acid, or a combination of citric acid and sulfuric acid.

Alternatively or in addition, the pH may be adjusted using a inorganic hydroxide compound being an alkali hydroxide that includes KOH, CsOH, and/or ammonium hydroxide.

Additionally, the compositions may contain other additives as desired, such as fluoride containing compounds and/or surfactants.

As used herein, "fluoride containing compounds" correspond to salts or acid compounds comprising a fluoride ion (F—) that is ionically bonded to another atom (such as HF).

As used herein the term "surfactant" refers to an organic compound that lowers the surface tension (or interfacial tension) between two liquids or between a liquid and a solid, typically an organic amphiphilic compound that contains a hydrophobic group (e.g., a hydrocarbon (e.g., alkyl) "tail") and a hydrophilic group. When present, surfactants for use in the compositions described herein include, but are not limited to, amphoteric salts, cationic surfactants, anionic surfactants, zwitterionic surfactants, non-ionic surfactants, and combinations thereof including, but not limited to, decylphosphonic acid, dodecylphosphonic acid (DDPA), tetradecylphosphonic acid, hexadecylphosphonic acid, bis (2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid (DDBSA), other $R_1$ benzene sulfonic acids or salts thereof (where the $R_1$ is a straight-chained or branched $C_8$-$C_{18}$ alkyl group), dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, octadecylphosphonic acid (ODPA), dodecyl phosphate. Non-ionic surfactants contemplated include, but are not limited to, polyoxyethylene lauryl ether, dodecenylsuccinic acid monodiethanol amide, ethylenediamine tetrakis (ethoxylate-block-propoxylate) tetrol, polyethylene glycols, polypropylene glycols, polyethylene or polypropylene glycol ethers, block copolymers based on ethylene oxide and propylene oxide, polyoxypropylene sucrose ether, t-octylphenoxypolyethoxyethanol, 10-ethoxy-9,9-dimethyldecan-1-amine, Polyoxyethylene (9) nonylphenylether, branched, Polyoxyethylene (40) nonylphenylether, branched, dinonylphenyl polyoxyethylene, nonylphenol alkoxylates, polyoxyethylene sorbitol hexaoleate, polyoxyethylene sorbitol tetraoleate, polyethylene glycol sorbitan monooleate, sorbitan monooleate, alcohol alkoxylates, alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives, siloxane modified polysilazanes, siliconepolyether copolymers, and ethoxylated fluorosurfactants. Cationic surfactants contemplated include, but are not limited to, cetyl trimethylammonium bromide (CTAB), heptadecanefluorooctane sulfonic acid, tetraethylammonium, stearyl trimethylammonium chloride, 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide, di(hydrogenated tallow) dimethylammonium chloride, and polyoxyethylene (16) tallow ethylmonium ethosulfate. Anionic surfactants contemplated include, but are not limited to, poly(acrylic acid sodium salt), ammonium polyacrylate, sodium polyoxyethylene lauryl ether, sodium dihexylsulfosuccinate, sodium dodecyl sulfate, dioctylsulfosuccinate salt, 2-sulfosuccinate salts, 2,3-dimercapto-1-propanesulfonic acid salt, dicyclohexyl sulfosuccinate sodium salt, sodium 7-ethyl-2-methyl-4-undecyl sulfate, phosphate fluorosurfactants, fluorosurfactants, and polyacrylates. Zwitterionic surfactants include, but are not limited to, acetylenic diols or modified acetylenic diols, ethylene oxide alkylamines, N,N-dimethyldodecylamine N-oxide, sodium cocaminpropinate, 3-(N,N-dimethylmyristylammonio)propanesulfonate, and (3-(4-heptyl)phenyl-3-hydroxypropyl)dimethylammoniopropanesulfonate.

With regard to compositional amounts, the weight percent ratios of other additive(s) to components (i), (ii), (iii), (iv), (v) is in one embodiment, in a range from about 0.001:1 to about 10:1, and in other embodiments, about 0.1:1 to about 5:1. The amount of the pH adjusting agent (i.e., the quaternary ammonium or phosphonium compound) is dependent on the final pH sought when preparing the removal composition for use, based on the pH values disclosed herein, and the knowledge of the person skilled in the art.

The range of weight percent ratios of the components will cover all possible concentrated or diluted embodiments of the composition. Towards that end, in one embodiment, a concentrated removal composition is provided that can be diluted for use as a cleaning solution. A concentrated composition, or "concentrate," advantageously permits a user (e.g. a CMP process engineer) to dilute the concentrate to the desired strength and pH at the point of use. Dilution of the concentrated aqueous composition may be in a range from about 1:1 to about 2500:1, about 5:1 to about 200:1, or about 20:1 to about 120:1, wherein the aqueous composition is diluted at or just before the tool with solvent, e.g., deionized water. It is to be appreciated by one skilled in the art that following dilution, the range of weight percent ratios of the components disclosed herein should remain unchanged.

In terms of substrates, the compositions of the invention are believed to be useful in cleaning low k dielectric materials as set forth herein.

Illustrative compositions, believed to be useful in removal of Ceria from low-k dielectric materials, provided by the present invention include the following:

TABLE 1

| Example | pH Adjustor | Complexant | Cleaning Additive | Oxidizer | Amine | DIW |
|---|---|---|---|---|---|---|
| 1 | 4% TMAH | 1% Citric acid | 2% Tetrethylene glycol mono butyl ether | 1% H2O2 | | Remainder |
| 2 | 4% TMAH | 1% Citric acid | 1% PVP | 1% H2O2 | | Remainder |
| 3 | 4% TMAH | 1% Citric acid | 0.05% hydroxyethyl Cellulose | 1% H2O2 | | Remainder |
| 4 | 4% TMAH | 1% Citric acid | 2% Tetrethylene glycol mono butyl ether | 1% Periodic Acid | | Remainder |
| 5 | 4% TMAH | 1% Citric acid | 1% PVP | 1% Periodic Acid | | Remainder |
| 6 | 4% TMAH | 1% Citric acid | 0.05% hydroxyethyl Cellulose | 1% Periodic Acid | | Remainder |
| 7 | 12% TEAH | 1% Citric acid | 2% Tetrethylene glycol mono butyl ether | 1% H2O2 | | Remainder |
| 8 | 12% TEAH | 1% Citric acid | 1% PVP | 1% H2O2 | | Remainder |
| 9 | 12% TEAH | 1% Citric acid | 0.05% hydroxyethyl Cellulose | 1% H2O2 | | Remainder |
| 10 | 12% TEAH | 1% Citric acid | 1% 1-Butoxy-2-propanol | 1% H2O2 | | Remainder |
| 11 | 12% TEAH | 1% Citric acid | 2% Tetrethylene glycol mono butyl ether | 1% H2O2 | 5% Ethanolamine | Remainder |
| 12 | 12% TEAH | 1% Citric acid | 1% PVP | 1% H2O2 | 5% Ethanolamine | Remainder |
| 13 | 12% TEAH | 1% Citric acid | 0.05% hydroxyethyl Cellulose | 1% H2O2 | 5% Ethanolamine | Remainder |
| 14 | 12% TEAH | 1% Citric acid | 1% PSSA | 1% H2O2 | | Remainder |
| 15 | 12% TEAH | 1% Citric acid | 1% PAA | 1% H2O2 | | Remainder |
| 16 | 12% TEAH | 1% Citric acid | 1% Butyl Carbitol | 1% H2O2 | | Remainder |

TABLE 1-continued

| Example | pH Adjustor | Complexant | Cleaning Additive | Oxidizer | Amine | DIW |
|---|---|---|---|---|---|---|
| 17 | 20% TEAH | 6% Citric acid | 10% Tetrethylene glycol mono butyl ether | 10% H2O2 | | Remainder |
| 18 | 20% TEAH | 6% Citric acid | 5% PVP | 10% H2O2 | | Remainder |
| 19 | 20% TEAH | 6% Citric acid | 2% hydroxyethyl Cellulose | 10% H2O2 | | Remainder |
| 20 | 12% TEAH | 1% Citric acid | 2% Tetrethylene glycol mono butyl ether | 1% Periodic Acid | | Remainder |
| 21 | 12% TEAH | 1% Citric acid | 1% PVP | 1% Periodic Acid | | Remainder |
| 22 | 12% TEAH | 1% Citric acid | 0.05% hydroxyethyl Cellulose | 1% Periodic Acid | | Remainder |
| 23 | 12% TEAH | 1% Citric acid | 2% Tetrethylene glycol mono butyl ether | 1% Periodic Acid | 5% Ethanolamine | Remainder |
| 24 | 12% TEAH | 1% Citric acid | 1% PVP | 1% Periodic Acid | 5% Ethanolamine | Remainder |
| 25 | 12% TEAH | 1% Citric acid | 0.05% hydroxyethyl Cellulose | 1% Periodic Acid | 5% Ethanolamine | Remainder |
| 26 | 10% Choline Hydroxide | 1% Citric acid | 2% Tetrethylene glycol mono butyl ether | 1% H2O2 | | Remainder |
| 27 | 10% Choline Hydroxide | 1% Citric acid | 1% PVP | 1% H2O2 | | Remainder |
| 28 | 10% Choline Hydroxide | 1% Citric acid | 0.05% hydroxyethyl Cellulose | 1% H2O2 | | Remainder |
| 29 | 10% Choline Hydroxide | 1% Citric acid | 2% Tetrethylene glycol mono butyl ether | 1% Periodic Acid | | Remainder |
| 30 | 10% Choline Hydroxide | 1% Citric acid | 1% PVP | 1% Periodic Acid | | Remainder |
| 31 | 10% Choline Hydroxide | 1% Citric acid | 0.05% hydroxyethyl Cellulose | 1% Periodic Acid | | Remainder |
| 32 | 11% TBAH | 1% Citric acid | 2% Tetrethylene glycol mono butyl ether | 1% H2O2 | | Remainder |
| 33 | 11% TBAH | 1% Citric acid | 1% PVP | 1% H2O2 | | Remainder |
| 34 | 11% TBAH | 1% Citric acid | 0.05% hydroxyethyl Cellulose | 1% H2O2 | | Remainder |
| 35 | 12% TEAH | 1% Tartaric acid | 2% Tetrethylene glycol mono butyl ether | 1% H2O2 | | Remainder |
| 36 | 12% TEAH | 1% Tartaric acid | 1% PVP | 1% H2O2 | | Remainder |
| 37 | 12% TEAH | 1% Tartaric acid | 0.05% hydroxyethyl Cellulose | 1% H2O2 | | Remainder |
| 38 | 12% TEAH | 1% Oxalic acid | 2% Tetrethylene glycol mono butyl ether | 1% H2O2 | | Remainder |
| 39 | 12% TEAH | 1% Oxalic acid | 1% PVP | 1% H2O2 | | Remainder |
| 40 | 12% TEAH | 1% Oxalic acid | 0.05% hydroxyethyl Cellulose | 1% H2O2 | | Remainder |
| 41 | 12% TEAH | 2% HEDP | 2% Tetrethylene glycol mono butyl ether | 1% H2O2 | | Remainder |
| 42 | 12% TEAH | 2% HEDP | 1% PVP | 1% H2O2 | | Remainder |
| 43 | 12% TEAH | 2% HEDP | 0.05% hydroxy ethyl Cellulose | 1% H2O2 | | Remainder |

In yet another embodiment, the compositions described herein further comprise ceria particles and/or CMP contaminants. The ceria particles and contaminants become a component of the composition after cleaning has begun and will be dissolved and/or suspended in the compositions.

The removal compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the compositions described herein. The kit may include, in one or more containers, a kit comprising one or more containers having components therein suitable for removing ceria particles and chemical mechanical polishing (CMP) contaminants from a microelectronic device having said particles and CMP contaminants thereon, wherein one or more containers of said kit contains at least one oxidizing agent; at least one complexing agent; at least one cleaning agent; at least one quaternary ammonium compound; and water for combining with additional solvent and/or water at the fab or the point of use. The containers of the kit must be suitable for storing and shipping the compositions and may be, for example, NOWPak® containers (Entegris, Inc., Billerica, Mass., USA).

In one embodiment, the one or more containers which contain the components of the aqueous removal composition include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, in certain embodiments the system includes a dispensing port for dispensing the blended removal composition to a process tool.

As applied to microelectronic manufacturing operations, the removal compositions described herein are usefully employed to clean ceria particles and/or CMP contaminants (e.g., post-CMP residue and contaminants) from the surface of the microelectronic device. In certain embodiments, the aqueous removal compositions remove at least 85% of the ceria particles present on the device prior to particle removal, at least 90%, at least 95%, or at least 99%.

In post-CMP particle and contaminant removal applications, the aqueous removal composition described herein may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In use of the compositions described herein for removing ceria particles and CMP contaminants from microelectronic devices having same thereon, the aqueous removal composition typically is contacted with the device for a time of from about 5 seconds to about 10 minutes, or about 1 sec to 20 min, or about 15 sec to about 5 minutes at temperature in a range of from about 20° C. to about 90° C., or about 20° C. to about 50° C. Such contacting times and temperatures are illustrative, and any other suitable time and temperature conditions may be employed that are efficacious to at least partially remove the ceria particles and CMP contaminants from the device, within the broad practice of the method. "At least partially clean" and "substantial removal" both correspond in certain embodiments to at removal of at least 85% of the ceria particles present on the device prior to particle removal, at least 90%, at least 95%, or at least 99%.

Following the achievement of the desired particle removal action, the aqueous removal composition may be readily removed from the device to which it has previously been applied, as may be desired and efficacious in a given end use application of the compositions described herein. In one embodiment, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled aqueous removal composition, wherein the removal composition may be recycled until particle and/or contaminant loading reaches the maximum amount the aqueous removal composition may accommodate, as readily determined by one skilled in the art.

A still further aspect relates to methods of manufacturing an article comprising a microelectronic device, said method comprising contacting the microelectronic device with an aqueous removal composition for sufficient time to remove ceria particles and CMP contaminants from the microelectronic device having said particles and contaminants thereon, and incorporating said microelectronic device into said article, using a removal composition described herein.

In another aspect, a method of removing ceria particles and CMP contaminants from a microelectronic device having same thereon is provided. Accordingly, in another aspect, the invention provides a method for removing ceria particles and chemical mechanical polishing contaminants from a microelectronic device having said particles and contaminants thereon, said method comprising:
 (i) contacting the microelectronic device with the composition of the invention; and
 (ii) at least partially removing said particles and contaminants from said microelectronic device with an aqueous solution comprising deionized water.

This invention can be further illustrated by the following examples of preferred embodiments thereof, although it will be understood that these examples are included merely for purposes of illustration and are not intended to limit the scope of the invention unless otherwise specifically indicated.

EXPERIMENTAL SECTION

Beaker-Dip Experiment Procedure

1. Dip Substrate in diluted Ceria Slurry for 5 min followed by DIW (deionized water) Rinse for 30 seconds 2. Dip slurry exposed substrate in diluted cleaner for 1 min followed by DIW Rinse for 30 seconds Performance Evaluation (Metrology):

Performance Evaluation Metrology: Post Clean Images of Coupons Collected by SEM

Total area of Ceria particles calculated by image analyzing software (Image J)

| | DI Water | Choline Hydroxide | TMAH | TEAH | Hydrogen Peroxide | Periodic Acid | Citric Acid | PSSA | PVP | TEGME | PETEOS Ave. Area | SIN Ave. Area | PolySi Ave. Area |
|---|---|---|---|---|---|---|---|---|---|---|---|---|---|
| Sample 1 | 95-99 | | 0.5-5 | | | | | | | | 127013 | 103460 | 114692 |
| Sample 2 | 95.2 | 4.8 | | | | | | | | | 124656 | 118113 | 125961 |

-continued

| | DI Water | Choline Hydroxide | TMAH | TEAH | Hydrogen Peroxide | Periodic Acid | Citric Acid | PSSA | PVP | TEGME | PETEOS Ave. Area | SIN Ave. Area | PolySi Ave. Area |
|---|---|---|---|---|---|---|---|---|---|---|---|---|---|
| Sample 3 | 93.8 | 4.8 | | | 1.4 | | | | | | 3801 | 1140 | 45357 |
| Sample 4 | 93.8 | 4.8 | | | | 1.4 | | | | | 4426 | 906 | 44625 |
| Sample 5 | 93.3 | 4.8 | | | 1.4 | | 0.5 | | | | 4696 | 904 | 74529 |
| Sample 6 | 93.3 | 4.8 | | | 1.4 | | | 0.5 | | | 5204 | 18140 | 59551 |
| Sample 7 | 93.75 | 4.8 | | | 1.4 | | | | 0.1 | | 556 | 1346 | 25292 |
| Sample 8 | 91.3 | 4.8 | | | 1.4 | | | | | 2.5 | 745 | 1458 | 31240 |
| Sample 9 | 92.8 | | | 5.8 | 1.4 | | | | | | 503 | 8247 | 56129 |

We claim:

1. A composition comprising
   (i) at least one oxidizing agent;
   (ii) at least one complexing agent;
   (iii) at least one cleaning agent;
   (iv) at least one quaternary ammonium or quaternary phosphonium compound or inorganic hydroxide; and
   (v) water;
wherein the cleaning composition has a pH that is greater than 8 and is devoid of corrosion inhibitors, etchants, and passivating agents.

2. The composition of claim 1, wherein the oxidizing agent is chosen from hydrogen peroxide, periodic acid, t-butylhydroperoxide, peracetic acid, potassium persulfate, ammonium persulfate, potassium peroxysulfate, potassium permanganate, and urea hydrogen peroxide.

3. The composition of claim 1, wherein the complexing agent is chosen from compounds the general formula $NR^1R^2R^3$, wherein $R^1$, $R^2$ and $R^3$ may be the same or different from one another and are chosen from hydrogen, straight-chain or branched $C_1$-$C_6$ alkyl, straight-chain or branched $C_1$-$C_6$ hydroxyalkyl, and $C_1$-$C_6$ alkyl ethers of straight chain or branched $C_1$-$C_6$ hydroxyalkyl groups.

4. The composition of claim 1, wherein the complexing agent is chosen from $C_1$-$C_8$ alkanolamines.

5. The composition of claim 1, wherein the complexing agent is chosen from 4-(2-hydroxyethyl)morpholine (HEM), 1,2-cyclohexanediamine-N,N,N',N'-tetraacetic acid (CDTA), ethylenediaminetetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, and combinations thereof.

6. The composition of claim 1, wherein the complexing agent is chosen from 1-hydroxyethylidene-1,1-diphosphonic acid (HEDP), 1,5,9-triazacyclododecane-N,N',N"-tris(methylenephosphonic acid) (DOTRP), 1,4,7,10-tetraazacyclododecane-N,N',N''',N''''-tetrakis(methylenep-hosphonic acid) (DOTP), nitrilotris(methylene)triphosphonic acid, diethylenetriaminepentakis(methylenephosphonic acid) (DETAP), aminotri(methylenephosphonic acid), bis(hexamethylene) triamine pentamethylene phosphonic acid, 1,4,7-triazacyclononane-N,N',N"-tris(methylenephosphonic acid (NOTP), hydroxyethyldiphosphonate, nitrilotris(methylene)phosphonic acid, 2-phosphono-butane-1,2,3,4-tetracarboxylic, carboxy ethyl phosphonic acid, aminoethyl phosphonic acid, glyphosate, ethylene diamine tetra(methylenephosphonic acid) phenylphosphonic acid, salts thereof.

7. The composition of claim 1, wherein the complexing agent is chosen from monoethanolamine, triethanolamine, sulfuric acid, citric acid and combinations thereof.

8. The composition of any one of claim 1, wherein the amount of complexing agent in the removal composition is in a range from about 0.01 wt % to about 10 wt %, based on the total weight of the composition.

9. The composition of claim 1, wherein the cleaning agent is a water miscible organic solvent that is chosen from methanol, ethanol, isopropanol, butanol, tetrahydrofurfuryl alcohol (THFA), 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 3-amino-4-octanol, 4-chloro-1-butanol, 2-chloroethanol), dichloromethane, chloroform, acetic acid, propionic acid, trifluoroacetic acid, tetrahydrofuran N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, dioxane, butyryl lactone, butylene carbonate, ethylene carbonate, propylene carbonate, dipropylene glycol, diethylene glycol monomethyl ether, and combinations thereof.

10. The composition of claim 1, further comprising a polymer.

11. The composition of claim 1, wherein the quaternary ammonium compound is chosen from choline hydroxide, tetramethyl ammonium hydroxide, tetraethyl ammonium hydroxide, and tetrabutyl ammonium hydroxide.

12. The composition of claim 1, wherein the cleaning agent is a water miscible organic solvent and is present in a range from about 0.0001 weight % to about 5 percent weight %, based on the total weight of the composition.

13. A method for removing ceria particles and chemical mechanical polishing contaminants from a microelectronic device having said particles and contaminants thereon, said method comprising:
   (i) contacting the microelectronic device comprising a low-k dielectric material with the composition of claim 1; and
   (ii) at least partially removing said particles and contaminants from said microelectronic device with an aqueous solution comprising deionized water.

14. The method of claim 13, wherein the low-k dielectric material is chosen from Poly-Si, PETEOS, silicon carbide, polymer films, silicon oxycarbide, silicon oxynitride and silicon nitride, silicon-containing organic polymers, silicon-containing hybrid organic/inorganic materials, organosilicate glass (OSG), TEOS, fluorinated silicate glass (FSG), silicon dioxide, and carbon-doped oxide (CDO) glass and carbon doped glass.

15. The method of claim 13, further comprising the step of diluting the composition with a solvent comprising water and/or water miscible organic solvents at or before a point of use, and optionally one or more surfactants.

* * * * *